US012597585B2

(12) United States Patent
Liu et al.

(10) Patent No.: US 12,597,585 B2
(45) Date of Patent: Apr. 7, 2026

(54) SHAPE-BASED PROXIMITY EFFECT CORRECTION METHOD FOR THROUGHPUT, PATTERNING FIDELITY, AND CONTRAST ENHANCEMENT OF PARTICLE BEAM LITHOGRAPHY AND IMAGING STRUCTURE

(71) Applicant: National Taipei University, New Taipei (TW)

(72) Inventors: Chun-Hung Liu, New Taipei (TW); Ze-An Ding, New Taipei (TW)

(73) Assignee: NATIONAL TAIPEI UNIVERSITY, New Taipei City (TW)

( * ) Notice: Subject to any disclaimer, the term of this patent is extended or adjusted under 35 U.S.C. 154(b) by 366 days.

(21) Appl. No.: 18/499,548

(22) Filed: Nov. 1, 2023

(65) Prior Publication Data

US 2025/0079115 A1      Mar. 6, 2025

(30) Foreign Application Priority Data

Sep. 1, 2023    (TW) ................................. 112133346

(51) Int. Cl.
*H01J 37/317*          (2006.01)
(52) U.S. Cl.
CPC ................................. *H01J 37/3174* (2013.01)
(58) Field of Classification Search
USPC .................................................. 250/492.22
See application file for complete search history.

(56) References Cited

U.S. PATENT DOCUMENTS

| | | | |
|---|---|---|---|
| 11,467,488 B2 | 10/2022 | Lo et al. | |
| 2012/0053892 A1* | 3/2012 | Matsuoka .............. | B82Y 40/00 |
| | | | 702/167 |
| 2016/0300338 A1* | 10/2016 | Zafar ...................... | G06F 18/22 |
| 2023/0244137 A1* | 8/2023 | Fujimura .................. | G03F 1/36 |
| | | | 716/53 |

OTHER PUBLICATIONS

Liu et al., "Shape-Based Proximity Effect Correction Method . . . " Applied Physics Express 16 (2023).

* cited by examiner

*Primary Examiner* — Kiet T Nguyen
(74) *Attorney, Agent, or Firm* — BACON & THOMAS, PLLC

(57) ABSTRACT

Disclosed herein is a proximity effect correction method based on shape adjustment for fabricating an imaging structure. The imaging structure comprises a bottom layer arranged on a substrate, and a top layer arranged on the upper surface of the bottom layer. The position of a surrounding frame of the top layer is closed to an edge of the bottom layer, which has a width value and a space value between the top and bottom layers. Additionally, the method combines with the use of increased particle beam sizes to improve the throughput, imaging fidelity and contrast of a particle beam lithography system. The method is applicable to any particle beam lithography machine or system, and does not require any internal hardware and software modifications to the machine or system.

9 Claims, 20 Drawing Sheets $$L_1 \quad + \quad L_2 \quad = \quad L_{1+2}$$

31      W      41      S      51

SHAPE-BASED PROXIMITY EFFECT CORRECTION METHOD FOR THROUGHPUT, PATTERNING FIDELITY, AND CONTRAST ENHANCEMENT OF PARTICLE BEAM LITHOGRAPHY AND IMAGING STRUCTURE

CROSS REFERENCE TO RELATED APPLICATIONS

This application claims the benefit of priority to Taiwan patent application no. 112133346 filed on Sep. 1, 2023 entitled "Shape-Based Proximity Effect Correction Method for Throughput, Patterning Fidelity, and Contrast Enhancement of Particle Beam Lithography and Imaging Structure", the contents of which are incorporated herein by reference in their entirety for all purposes.

TECHNICAL FIELD

The disclosure relates to a proximity effect correction method, particularly a shape-based proximity effect correction method for throughput, fidelity, and contrast enhancement of particle beam lithography and imaging structure.

BACKGROUND

Extreme ultraviolet lithography (EUVL) is a leading technology that utilizes extreme ultraviolet (EUV) wavelength. Its principle involves transferring EUV light through a reflective mask onto a wafer. Electron-beam lithography plays a crucial role in manufacturing these masks, which are used not only for creating masks but also for manufacturing chips. Compared with variable-shape-beam writers, multi-Gaussian-beam writers exhibit more reasonable writing times in manufacturing complex mask layouts.

However, exposure time of the masks is a bottleneck for high-volume manufacturing. One solution is to adopt a larger particle beam size (BS) for further decreasing the beam-exposure time, thereby enabling more particles (including electrons) into the imaging structure (resulting in the formation of the exposed layer) and permitting a higher particle count. Another solution is to adopt low-acceleration voltage, which can improve the sensitivity of particle interactions within the imaging structure and the exposed layer.

Although the approach of larger particle beam size (BS) or lower-acceleration voltage can increase production yield (improving exposure efficiency), the gentle slope of the accumulated dose distribution within the imaging structure leads to the degradation of pattern fidelity and image contrast.

To lower the impact of the proximity effect on pattern fidelity, existing methods can be generally classified as dose, shape, and dose-shape hybrid correction methods. Dose and hybrid correction methods determine the proper dose, which requires time-consuming computation because each dose at each beam-shot position needs to be calculated individually within the patterns. By contrast, shape correction method with a single-dose only needs to modify the proper-dissected edge of the pattern shape. Therefore, the computation amount for shape correction method should be lower than that for dose correction method. In addition, shape correction method allows a single-dose corrected layout to be applied to various electron-beam (e-beam) writers, particularly those having no ability to apply multiple doses during exposure.

Although shape correction method could demonstrate lower computational effort and more practicable compatibility compared with dose correction method, the correction effectiveness of shape correction method may be limited when using edge-placement error (EPE) for calculating the correction amount under severe resist contour distortions. Moreover, single-dose shape correction method can only improve pattern fidelity, but cannot improve both pattern fidelity and image contrast.

BRIEF DESCRIPTION OF THE DRAWINGS

FIG. 11(*c*) illustrates the local structure of a region E2 as shown in FIG. 11(*a*).

FIG. 12(*b*) illustrates the local structure of a region D3 as shown in FIG. 12(*a*).

FIG. 12(*c*) illustrates the local structure of a region E3 as shown in FIG. 12(*a*).

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Figure 1:
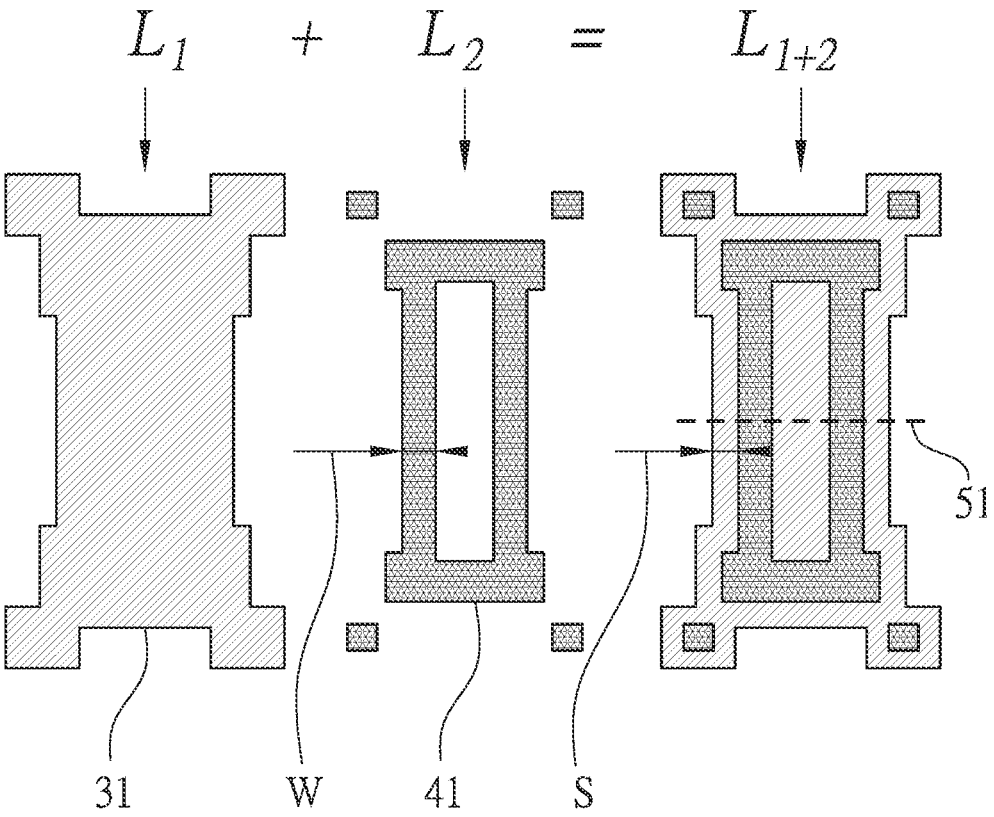
FIG. 1 is a top view illustrating a bottom layer, accumulated energy a top layer, and an imaging structure according to some embodiments of the present disclosure.

FIG. 1 illustrates an example of an imaging structure (L$_{1+2}$) in accordance with aspects of the present disclosure. The imaging structure (L$_{1+2}$) is an energy-absorbing structure within the photomask, primarily designed for on-mask imaging. The imaging structure (L$_{1+2}$) may be used in the extreme ultraviolet lithography (EUVL) process, which is a leading technology employing extreme ultraviolet wavelengths, and is not limited thereto. The imaging structure (L$_{1+2}$) is typically placed on a reflective mask, facilitating the transmission of extreme ultraviolet wavelengths onto the surface of a wafer for the purpose of exposure. Given that the EUVL process is already adopted by integrated circuit manufacturers, the technical specifics are not a primary focus of the present disclosure, and will not be further elaborated herein. By way of example, and not limitation, the imaging structure (L$_{1+2}$) may be used in masks for other types of integrated circuits.

The imaging structure (L$_{1+2}$) may be situated on a reflective substrate (not shown in the figure), and is not limited thereto. The imaging structure (L$_{1+2}$) comprises a bottom layer (L$_1$), a top layer (L$_2$), a width (W), and a space (S). The bottom layer (L$_1$) is formed on the substrate and includes a base pattern 31. The top layer (L$_2$) is formed on top of the bottom layer (L$_1$) and includes a compensatory pattern (41). The width (W) is defined by the opposing sides of the compensatory pattern 41 of the top layer (L$_2$), constituting the width (W) of the top layer (L$_2$). The space (S) is defined by the lateral sides of the base pattern 31 on the bottom layer (L$_1$) and the lateral sides of the compensatory pattern 41 on the top layer (L$_2$), constituting the space (S) between the bottom layer (L$_1$) and the top layer (L$_2$).

In the manufacturing process of the imaging structure (L$_{1+2}$) on the photomask, particle beam lithography, including electron beam lithography, is a critical technology. This particle beam lithography is not only employed for producing the imaging structure (L$_{1+2}$) on the mask, but can also be directly used to manufacture the circuit structures on the wafer.

The imaging structure is utilized in the semiconductor exposure process, where a particle beam size (BS) is chosen for exposure, the width (W) is selected from an optimal width (W$_{opt}$), and the space (S) is selected from an optimal space (S$_{opt}$). The relationship between the optimal width (W$_{opt}$) and the particle beam size (BS) is defined as follows:

$$W_{opt} = 0.86\ BS + 2.49.$$

The relationship between the optimal space (S$_{opt}$) is defined as follows:

$$S_{opt} = 0.018\ BS^2 + 0.05\ BS + 0.01.$$

Figure 2:
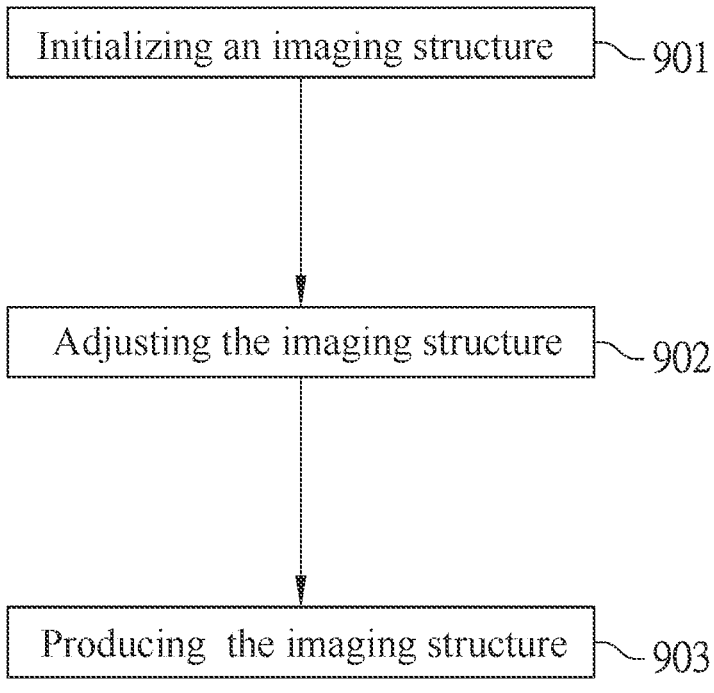
FIG. 2 is a flow chart illustrating a shape-based proximity effect correction method aimed at enhancing throughput, patterning fidelity, and contrast enhancement of particle beam lithography for the production of the imaging structure.

FIG. 2 is a flow chart illustrating a shape-based proximity effect correction method aimed at enhancing throughput, patterning fidelity, and contrast enhancement of particle beam lithography for initializing, adjusting and producing the imaging structure. The method comprises a step of initializing an imaging structure 901, a step of adjusting the imaging structure 902, and a step of producing the imaging structure 903.

In step of initializing an imaging structure 901, a target pattern 21 is established, and the imaging structure (L$_{1+2}$) is initialized. This imaging structure (L$_{1+2}$) comprises a bottom layer (L$_1$) with a base pattern 31, and a top layer (L$_2$) positioned on top of the bottom layer (L$_1$), including a compensatory pattern 41. The width (W) is defined by the opposing sides of the compensatory pattern 41 on the top layer (L$_2$), while the space (S) is defined by the lateral sides of the base pattern 31 on the bottom layer (L$_1$) and the lateral sides of the compensatory pattern 41 on the top layer (L$_2$). The imaging structure (L$_{1+2}$) is used in an exposure apparatus to produce an imaging pattern.

The target pattern 21 may represent an ideal exposure pattern designed for use in integrated circuits. The imaging pattern can be either a computer-simulated exposure pattern or an actual exposure pattern created using extreme ultraviolet light. Since the computer-simulated exposure pattern is generated through simulations of extreme ultraviolet light wavelength irradiation, the method may be utilized during the product development phase of the imaging pattern. Computers are initially used to simulate the optimal imaging structure (L$_{1+2}$) and generate a simulated exposure pattern. The simulated exposure pattern is then employed to refine the imaging structure (L$_{1+2}$) to closely approximate the target pattern 21, resulting in significantly reducing the development time for photomask products.

The energy responses of the bottom layer (L$_1$) and the top layer (L$_2$) are identical, meaning that the structural heights of both the bottom layer (L$_1$) and the top layer (L$_2$) are set to be the same. In such way, when the particle beam is directed onto the photoresist, the applied dose for both the bottom layer (L$_1$) and the top layer (L$_2$) is identical. Alternatively, when extreme ultraviolet wavelengths are used to irradiate the imaging structure (L$_{1+2}$), the energy responses of the bottom layer (L$_1$) and the top layer (L$_2$) are also identical. By way of example, and not limitation, the structural parameters and height settings of the bottom layer ($L_1$) and the top layer ($L_2$) may be adjusted as needed based on the specific circumstances.

Figure 3:
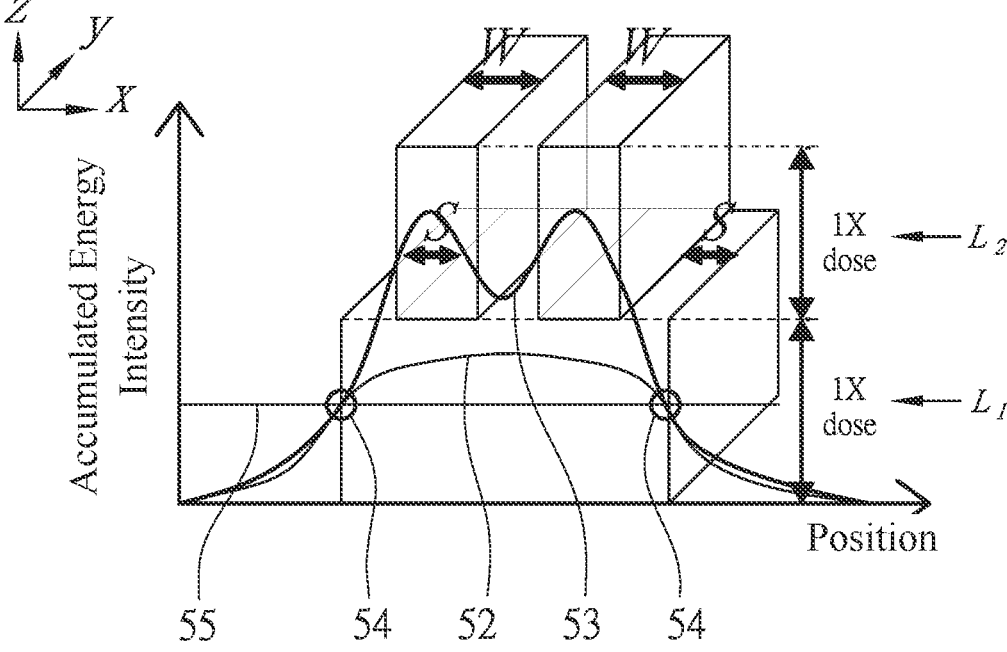
FIG. 3 is a schematic cross-sectional view along a first dotted line as shown in FIG. 1, illustrating the corresponding accumulated energy intensity.

FIG. 3 is a schematic cross-sectional view along a first dotted line as shown in FIG. 1, illustrating the sectional positions within the imaging structure ($L_{1+2}$) and their corresponding accumulated energy intensities. In FIG. 3, the horizontal axis represents the position along the section line within the imaging structure ($L_{1+2}$), while the vertical axis represents the accumulated energy intensity. Given the relative relationship between the position along the section line and the accumulated energy intensity, specific units are not assigned to these axes. As depicted in FIG. 3, the structural heights of both the bottom layer ($L_1$) and the top layer ($L_2$) are substantially identical, meaning that both the bottom layer ($L_1$) and the top layer ($L_2$) receive equivalent doses (both exposed to a 1× dose).

In FIG. 3, a first curve 52 represents the accumulated energy intensity achieved using a conventional shape correction method. This conventional shape correction method involves employing a single layer of light-absorbing structure, specifically only the bottom layer ($L_1$) was utilized, and no top layer ($L_2$) was introduced. A second curve 53 represents the accumulated energy intensity of the imaging structure ($L_{1+2}$), which comprises both the bottom layer ($L_1$) and the top layer ($L_2$). Both the first curve 52 or the second curve 53, in relation to a threshold 55 of energy intensity, reach a critical point 54 in the accumulated energy intensity. Through FIG. 3, it is understood that the imaging structure ($L_{1+2}$) exhibits a steeper energy slope compared with the conventional shape correction method. In other words, the second curve 53 demonstrates a steeper slope between the bottom layer ($L_1$) and the top layer ($L_2$) when compared with the first curve 52. Consequently, when employed in the extreme ultraviolet lithography (EUVL) process, the imaging structure ($L_{1+2}$) can deliver better contrast compared with structures generated using the conventional shape correction method. Moreover, an in-house correction engine with a proportional-integral-derivative (PID) feedback controller was adopted to calculate the imaging structure ($L_{1+2}$).

Figure 4:
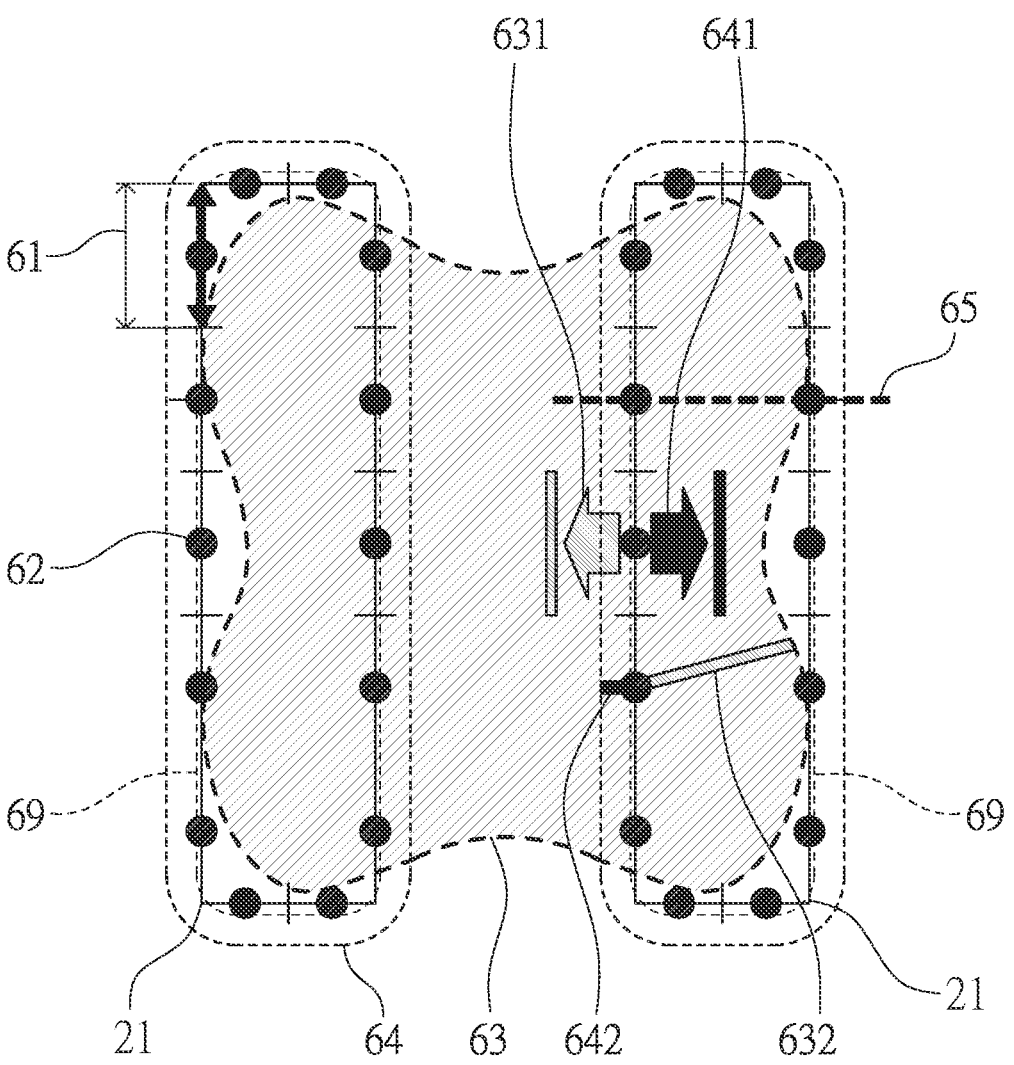
FIG. 4 is a top view illustrating the simulation of accumulated energy of two adjacent target patterns respectively using a large particle beam size (BS) and a small particle beam size (BS) in addition to the imaging structure of the present disclosure.

FIG. 4 illustrates the simulation of accumulated energy of two adjacent target patterns 21 respectively using a large particle beam size (BS) and a small particle beam size (BS) in addition to the imaging structure ($L_{1+2}$), so as to simulate an exposure pattern. A plurality of segments 61 along the edges of the target pattern 21, and a plurality of target points 62 positioned on the plurality of segments 61 are defined.

When the plurality of segments 61 on the two target patterns 21 are incorrectly moved in the first moving direction 631, and a large beam size (BS) is used for simulation, a first imaging pattern 63 is produced. The utilization of a large particle beam size (BS) results in a more significant impact of the surrounding proximity effect, causing the plurality of segments 61 in the first moving direction 631 to bring the two target patterns 21 closer together. This results in the merging of accumulated energy areas from the particle beam, and an increased first separation distance 632 between the target pattern 21 and the first imaging pattern 63. Therefore, when the position of the plurality of segments 61 on the target pattern 21 moved in wrong direction, and the particle beam size (BS) is too large, it leads to a significant error in the first imaging pattern 63.

Figure 5:
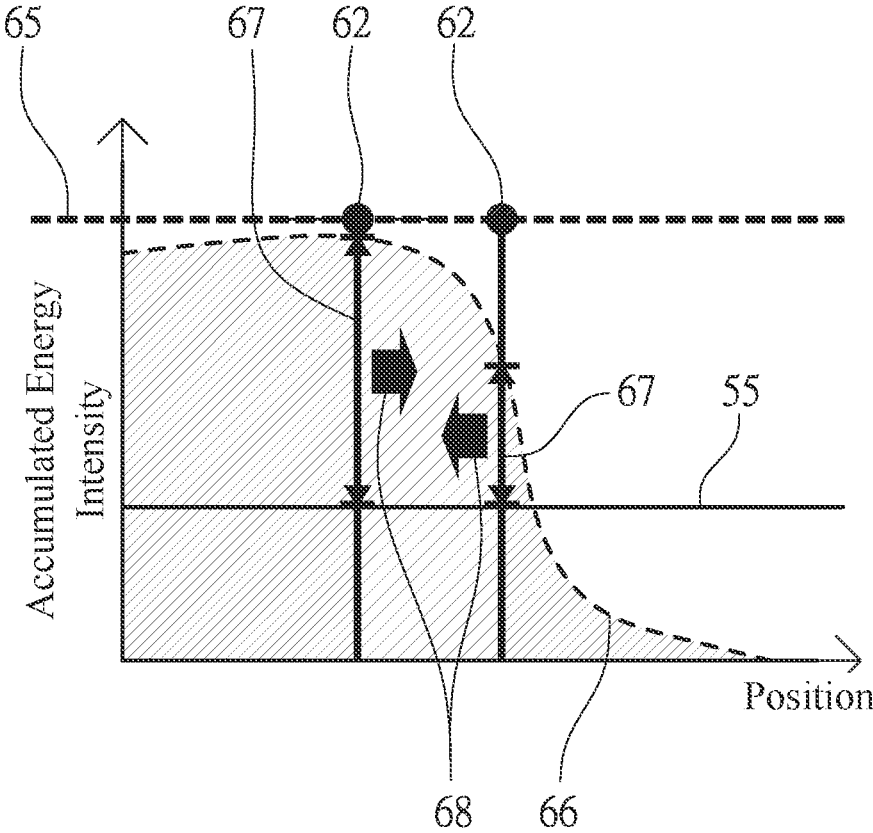
FIG. 5 is a cross-sectional view illustrating the accumulated energy intensity along a second dotted line as shown in FIG. 4, and shows the calculation process using the intensity error (IE) and the subsequent movement direction.

FIG. 5 is a cross-sectional view illustrating the accumulated energy intensity along a second dotted line 65 as shown in FIG. 4. The horizontal axis represents the relative position along the cross-section of the second dotted line 65, while the vertical axis represents the corresponding accumulated energy intensity. In FIG. 5, a third curve 66 corresponds to the accumulated energy intensity of the first imaging pattern 63 generated using a larger particle beam size (BS). The intensity error (IE) index is calculated from the differences between the energy intensity and the threshold 55 at each target point 62 positioned on the plurality of segments 61. This calculation determines the accuracy of the movement direction and the required correction amount, consequently yielding the correction amount in the direction of correction 68.

Looking back at FIG. 4, when the segments 61 of the two target patterns 21 are set to move in the correct second moving direction 641, and a small beam size (BS) is used for simulation, a second imaging pattern 64 is produced. The second imaging pattern 64 is less influenced by the surrounding proximity effect of the small particle beam size (BS). The segments 61 in the second moving direction 641 maintain an appropriate distance between the two target patterns 21, preventing them from getting too close and causing the merging of the accumulated energy areas of the particle beams. Consequently, the second separation distance 642 between the second imaging pattern 64 and the two target patterns 21 is significantly shorter than that of the first imaging pattern 63. Therefore, when the segments 61 on the target pattern 21 move in correct direction, and the particle beam size (BS) is adjusted to be small, the error can be reduced to improve the pattern fidelity.

Referring back to FIGS. 1, 2, and 4, in step of initializing an imaging structure 901, the plurality of segments 61 along the edges of the target pattern 21, and the plurality of target points 62 positioned on the plurality of segments 61 are defined. The target points 62 serve as analysis for the target pattern 21 to determine the positions of the plurality of segments 61. The plurality of segments 61 are iteratively moved according to the correction amount determined by the PID controller, so as to define the base pattern 31 on the bottom layer ($L_1$) in subsequent steps.

In step of adjusting the imaging structure 902, the plurality of segments 61 are adjustable, and different particle beam sizes (BS) are configured for simulating the imaging structure ($L_{1+2}$), so as to generate the imaging pattern and perform corrections. The width (W) and space (S) for the compensatory pattern 41 on the top layer ($L_2$) are defined. In some embodiments, the adjustment of the plurality of segments 61 is used to shape the base pattern 31 on the bottom layer ($L_1$). Each segment 61 on the bottom layer ($L_1$) is iteratively moved according to the correction amount determined by the PID controller until the edge-placement error (EPE) for each segment 61 falls within a defined tolerance. Subsequently, based on the combination of width (W) and space (S) values, the intensity error (IE) is applied to iteratively calculate correction amount until the corrected contour falls within the defined tolerance, and simultaneously modify both the base pattern 31 on the bottom layer ($L_1$) and the compensatory pattern 41 on the top layer ($L_2$), simulating the imaging pattern and make corrections until the contour difference between corrected imaging pattern and target pattern 21 is within the defined tolerance. Additionally, a convergence criterion is established during simulation to ensure that the corrected imaging pattern falls within the defined tolerance.

The intensity error (IE) index was adopted by the method in the present disclosure instead of the traditional edge-placement error (EPE) index. Further, Monte-Carlo simulation was used for obtaining the point spread function (PSF) within a 64 nm-thick HSQ resist of a binary high-numerical-aperture EUV mask structure at 5 keV. The linear e-beamexposure model is adopted to determine the effective absorbed energy in the imaging structure through a convolution of the PSF with the written dose of the pattern. The segment length, (P, I, D) parameters, maximum iteration, EPE convergence criterion, and grid size were set as 20 nm, (5, 0.1, 0), 100 times, 0.3 nm and 0.1 nm, respectively.

The width (W) of the compensation pattern 41 on the top layer (L$_2$) is relative to the energy slope, and the compensation pattern 41 on the top layer (L$_2$) can further save the exposure writing time. For example, in regions with smaller exposure patterns, a narrower compensation pattern 41 on the top layer (L$_2$) can be employed. Furthermore, the compensation pattern 41 on the top layer (L$_2$) can improve the slope under various particle beam sizes (BS) and on-target conditions.

Figure 6A:
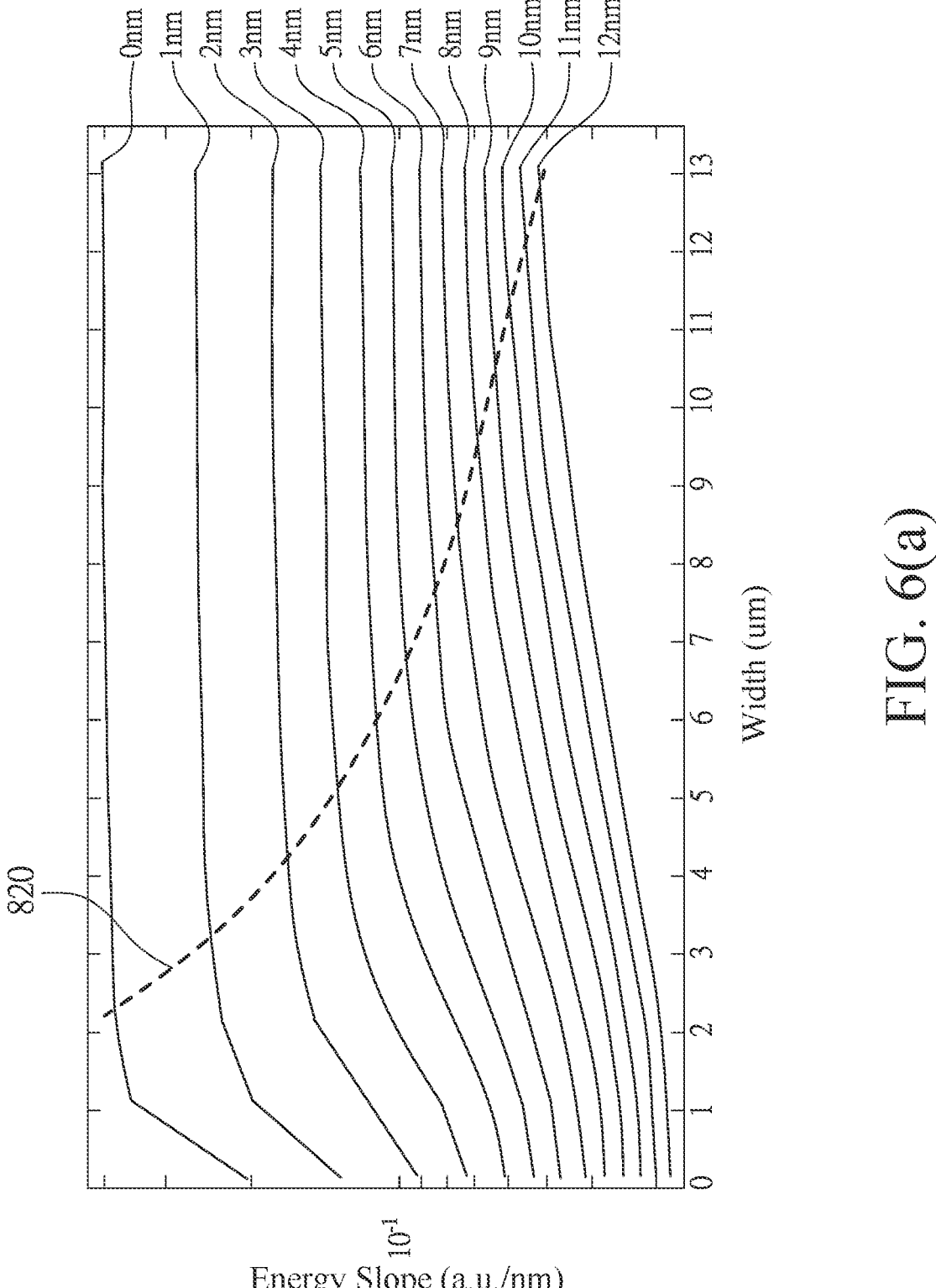
FIG. 6(a) exhibits the changes in energy slope for various particle beam sizes (BS) and various widths (W) as shown in FIG. 3 in an isolated (Iso) rectangular pattern environment.
Figure 6B:
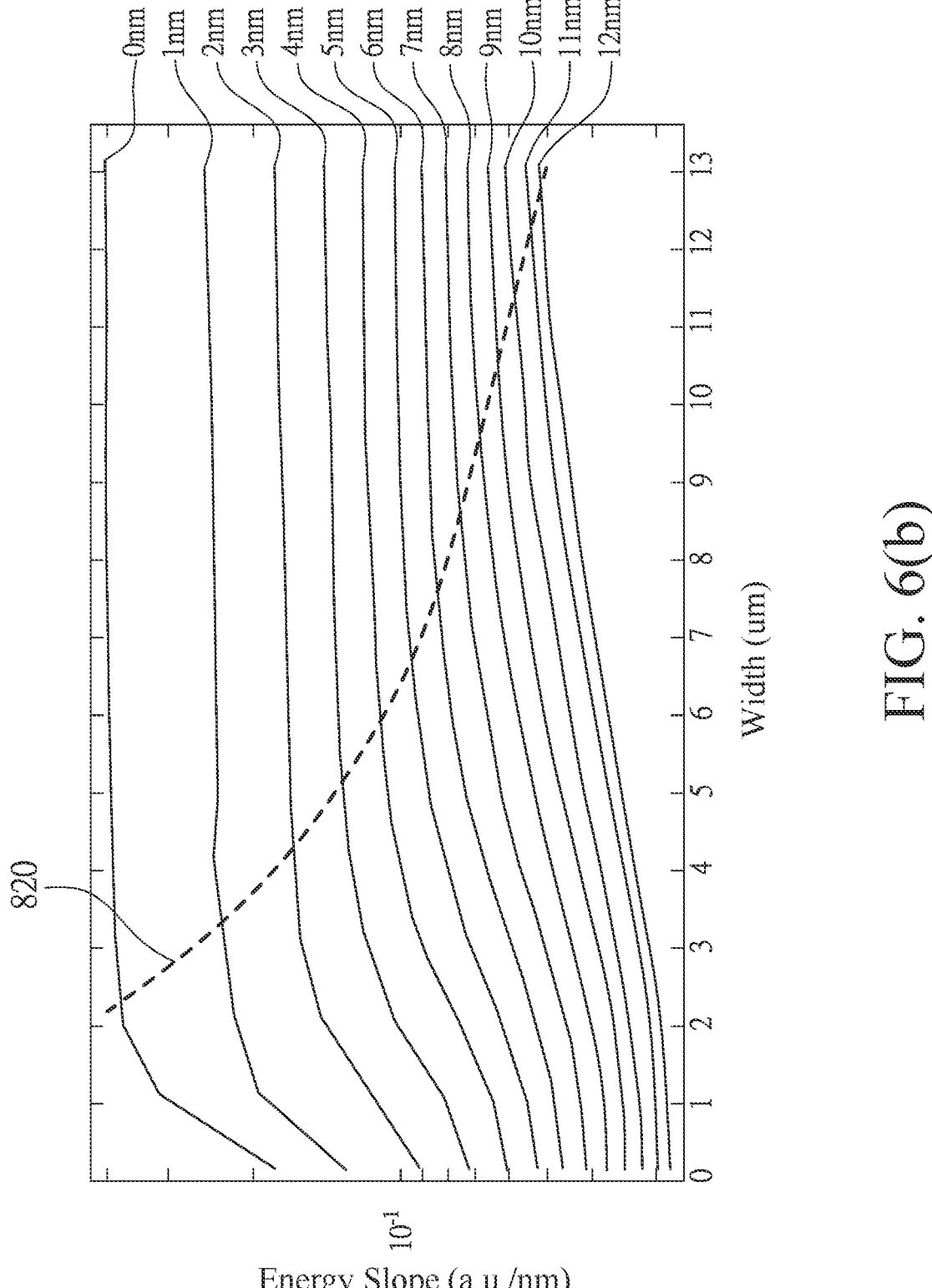
FIG. 6(b) exhibits the changes in energy slope for various particle beam sizes (BS) and various widths (W) as shown in FIG. 3 in a dense patent with 50% pattern density environment.
Figure 6C:
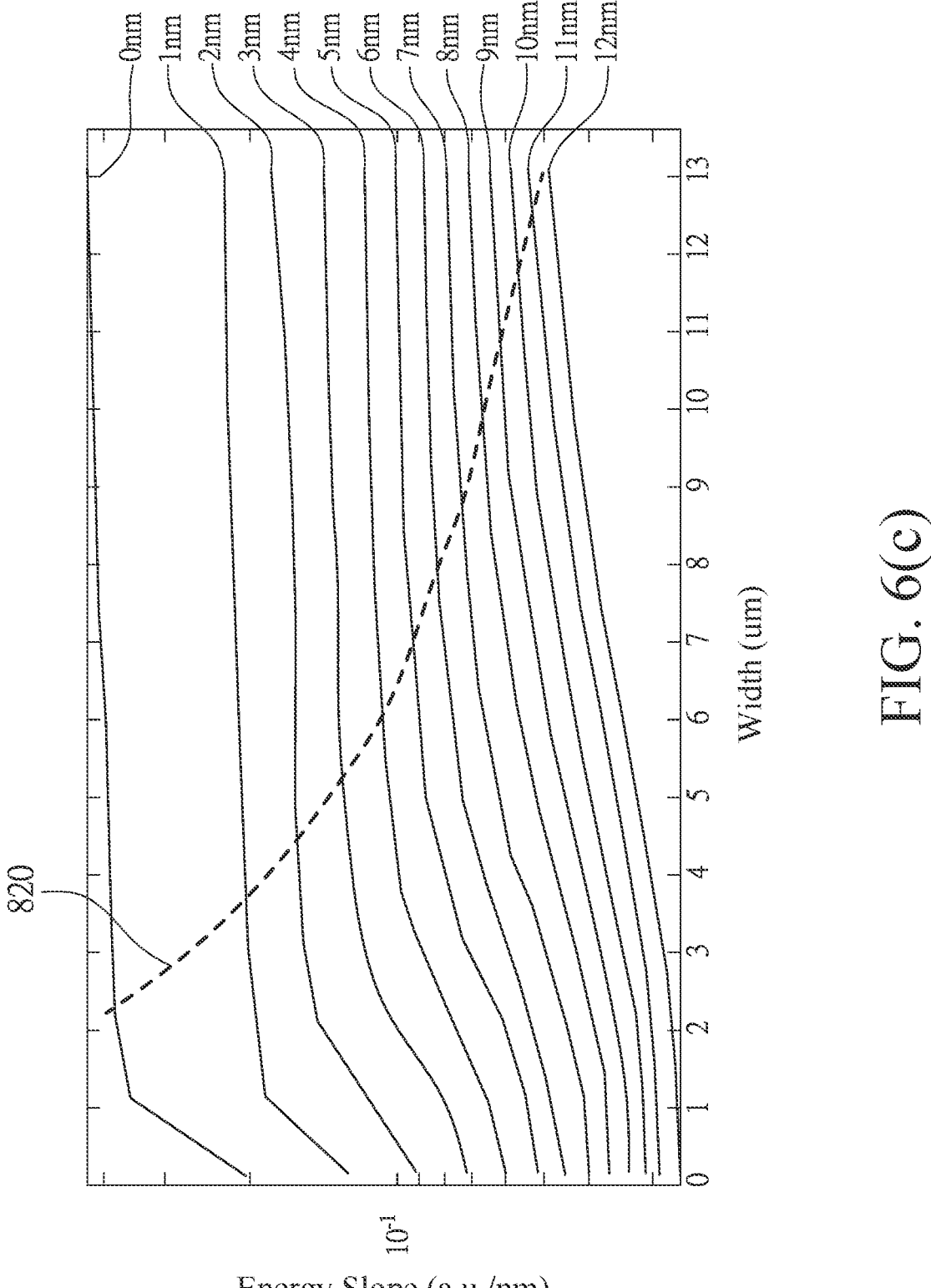
FIG. 6(c) exhibits the changes in energy slope for various particle beam sizes (BS) and various widths (W) as shown in FIG. 3 in a dense patent with 75% pattern density environment.

FIGS. 6(*a*), 6(*b*) and 6(*c*) illustrate the changes in energy slope for various particle beam sizes (BS) and various widths (W) in different pattern environments: 1. an isolated (Iso) rectangular pattern (32 nm width and 1 µm length, as shown in FIG. 6(*a*)), 2. dense patterns with 50% pattern density (PD) (as shown in FIGS. 6(*b*)), and 3. dense patterns with 75% pattern density (PD) (as shown in FIG. 6(*c*)). The space (S) of the imaging structure (L$_{1+2}$) was set to 0. The horizontal axis represents different widths (W) in nm, ranging from 1 nm to 13 nm, while the vertical axis indicates the energy slope in a.u./nm. When width (W) was equal to 0, it indicates that the top layer (L$_2$) was absent on the bottom layer (L$_1$). The energy slope increases upon increasing width (W) for various particle beam sizes (BS). The largest energy slope is achieved when the top layer (L$_2$) has a largest width (W) of 13 nm, and the bottom layer (L$_1$) has a width of 26 nm. In FIGS. 6(*a*), 6(*b*), and 6(*c*), the curves from top to bottom represent the numerical curves obtained for particle beam sizes (BS) equal to 0 nm, 1 nm, 2 nm, 3 nm, 4 nm, 5 nm, 6 nm, 7 nm, 8 nm, 9 nm, 10 nm, 11 nm, and 12 nm, respectively.

Although the largest width (W) of 13 nm shows the largest slope, the exposure time increases the most. A curve 820 illustrated in FIGS. 6(*a*), 6(*b*), and 6(*c*), represents the optimal width (W$_{opt}$) corresponding to each particle beam size (BS). The trend of slope improvement is similar to a logarithm function, and the relative slope improvement should be >5%. The curve 820 represents a trade-off between the slope improvement and decreasing width (W). In other words, the optimal width (W$_{opt}$) of the top layer (L$_2$) can reduce exposure time while maintaining a better energy slope. The improvement in width (W) within the region below the curve is more significant than that within the region above the curve.

Figure 7:
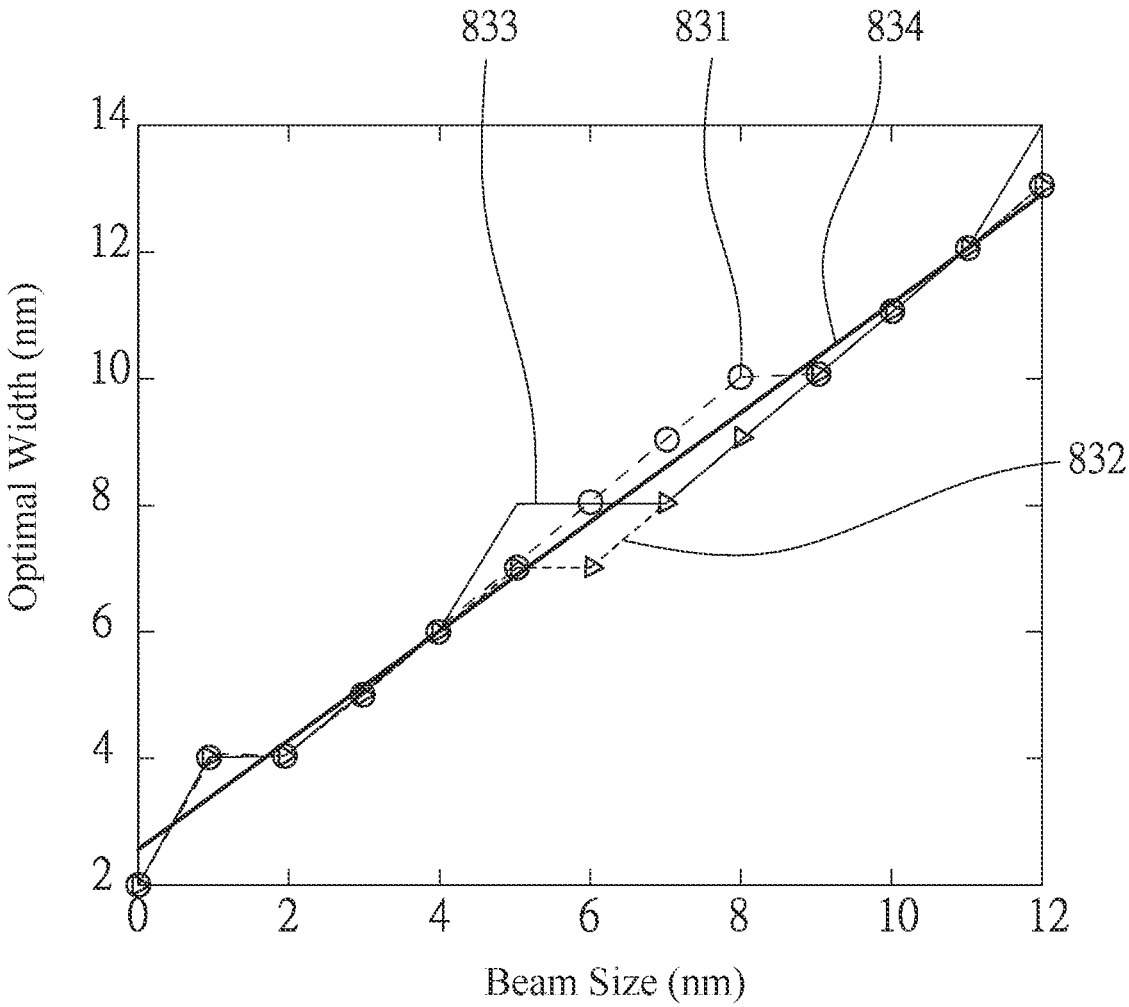
FIG. 7 illustrates the variations between different particle beam sizes (BS) and optimal width ($W_{opt}$) in different pattern environments.

As shown in FIG. 7, the optimal width (W$_{opt}$) for various particle beam sizes (BS) is defined. A curve 831 indicates the optimal width (W$_{opt}$) for Iso environment, a curve 832 indicates the optimal width (W$_{opt}$) for PD 50% environment, and a curve 833 indicates the optimal width (W$_{opt}$) for PD 75% environment. A curve 834 is derived from the average optimal width (W$_{opt}$) of the curves 831, 832, and 833. The horizontal axis represents the particle beam size (BS) in nm, and the vertical axis represents the optimal width (W$_{opt}$) in nm. FIG. 7 shows the relationship between the optimal width (W$_{opt}$) and the corresponding particle beam size (BS), demonstrating a close correlation among the three different environments: Iso, PD 50%, and PD 75% environments. The average results of the three environments are summarized in the curve 834 as shown in FIG. 7, with a fitting accuracy of 0.98 R-squared (R$^2$) to represent the relationship between the optimal width (W$_{opt}$) and the corresponding particle beam size (BS) as follows:

$$W_{opt} = 0.86 \; BS + 2.49.$$

Figure 8A:
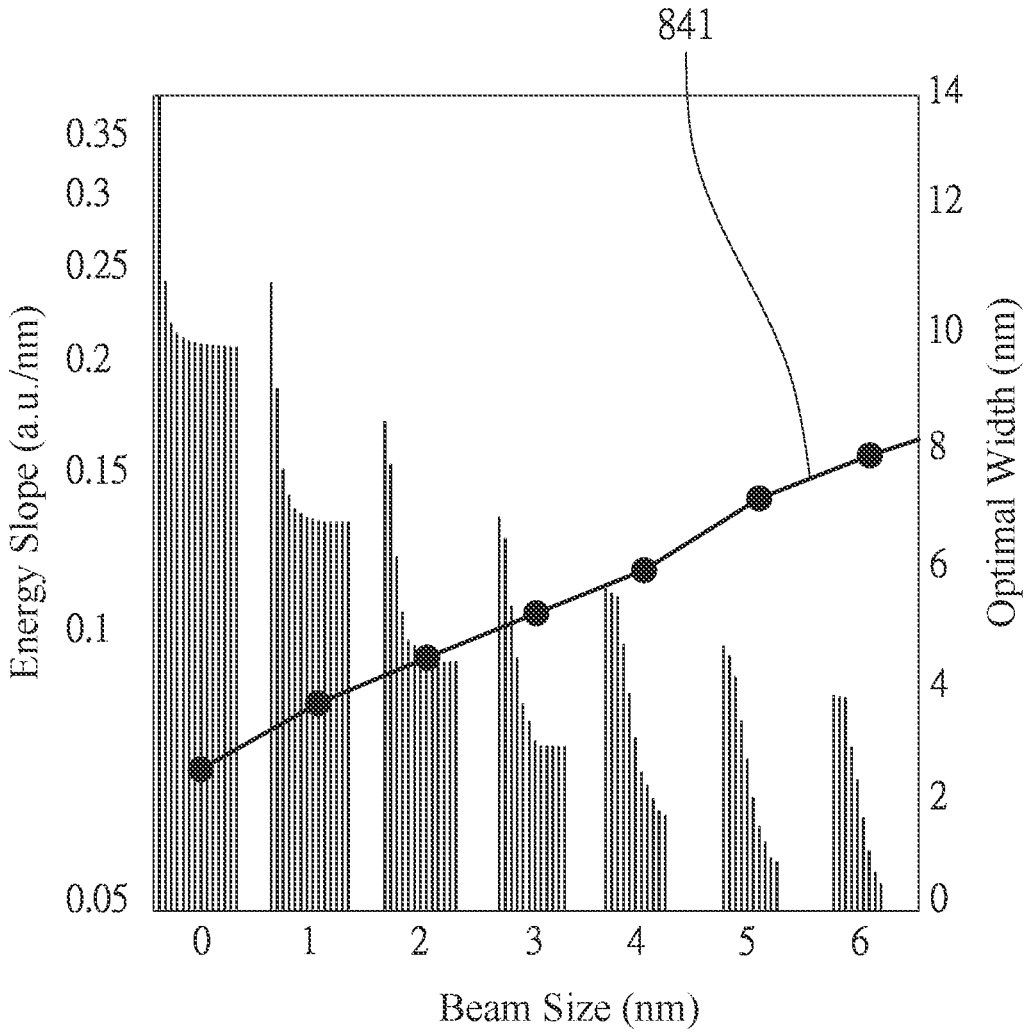
FIG. 8(a) exhibits the changes in energy slope for different spaces (S) as shown in FIG. 3 and the corresponding optimal width ($W_{opt}$) when the particle beam size (BS) is varied from 0 nm to 6 nm.
Figure 8B:
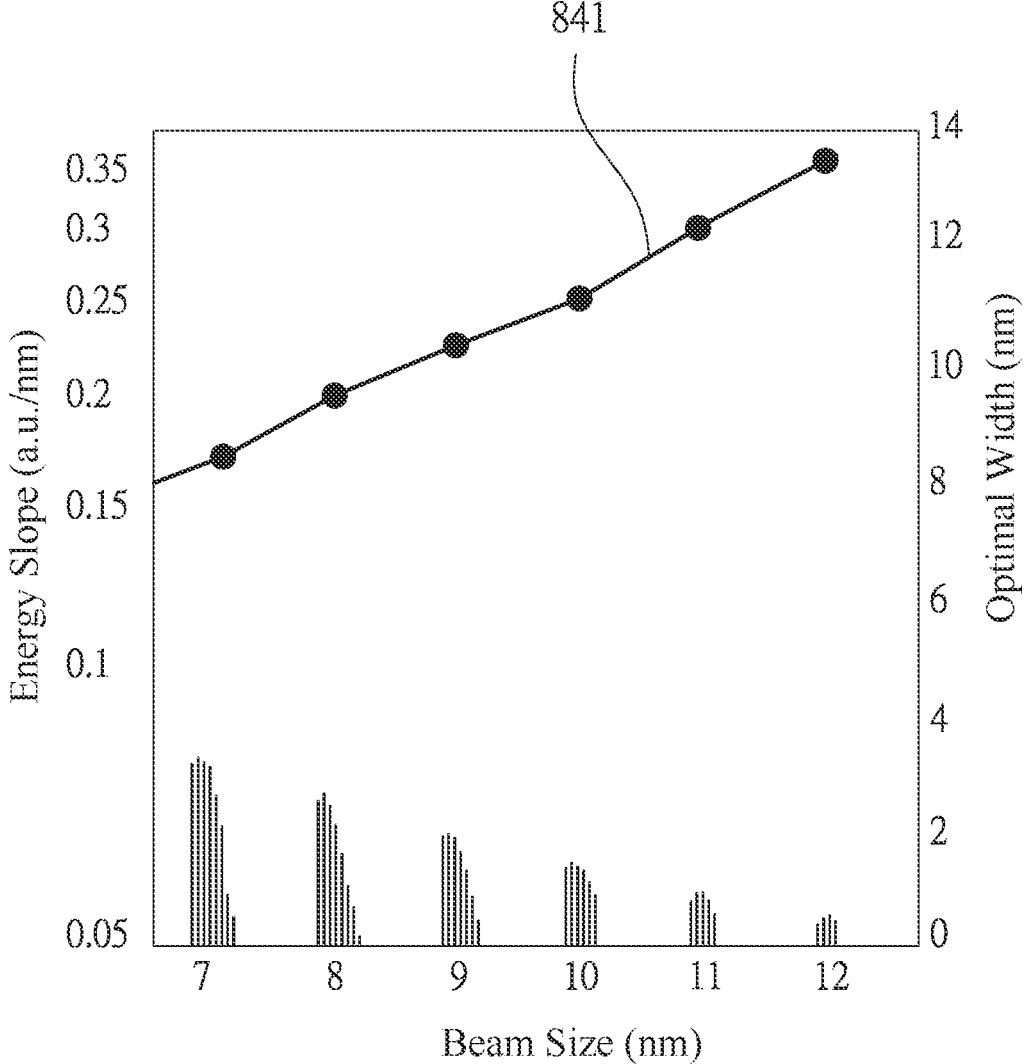
FIG. 8(b) exhibits the changes in energy slope for different spaces (S) as shown in FIG. 3 and the corresponding optimal width ($W_{opt}$) for the particle beam size (BS) is varied from 7 nm to 12 nm.

Under different particle beam sizes (BS) and their corresponding optimal widths (W$_{opt}$), the analysis of the energy slope generated by the imaging structure (L$_{1+2}$) is conducted at different space (S). As shown in FIGS. 8(*a*) and 8(*b*), which illustrates the slope variation with the particle beam size (BS) and corresponding optimal width (W$_{opt}$) for various spaces (S) under the PD 50% environment. The left axis represents the energy slope in a.u./nm, the horizontal axis represents the particle beam size (BS) in nm, and the right axis represents the optimal width (W$_{opt}$) in nm. For each particle beam size (BS) displayed, the multiple energy slopes from left to right represent space (S) of 0 nm, 1 nm, 2 nm, 3 nm, 4 nm, 5 nm, 6 nm, 7 nm, 8 nm, 9 nm, 10 nm, 11 nm, 12 nm, and 13 nm. A curve 841 represents the optimal width (W$_{opt}$) for each particle beam size (BS).

FIG. 8(*a*) reveals that the largest slope appears at space (S)=0 nm when the particle beam size (BS) is varied from 0 to 6 nm, but FIG. 8(*b*) reveals that the largest slope does not appear at space (S)=0 nm when the particle beam size (BS) increases from 7 to 12 nm. In different space (S) values, when the energy slope is less than 0.05 a.u./nm, it will not be shown in FIGS. 8(*a*) and 8(*b*).

Figure 9:
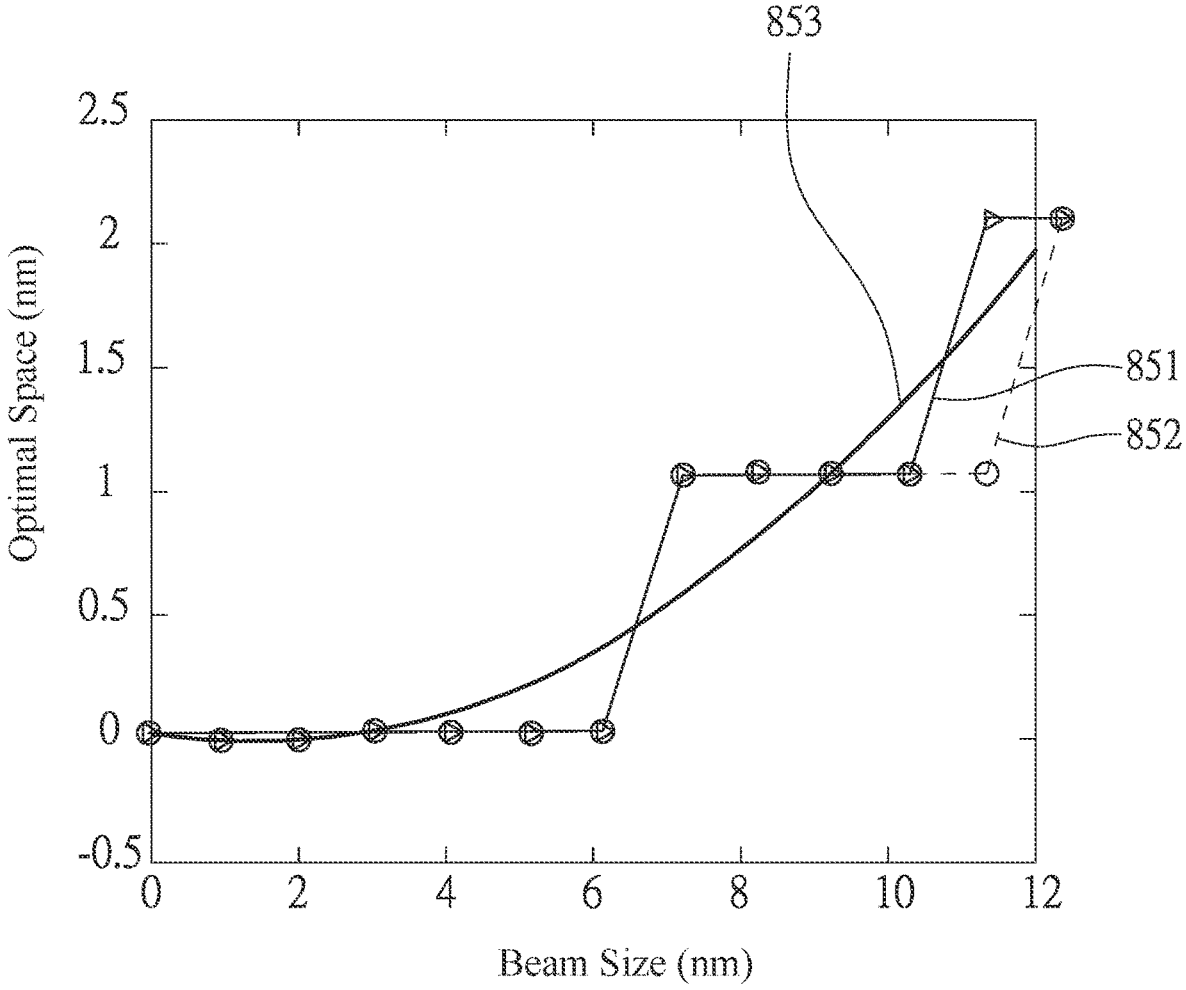
FIG. 9 exhibits the changes in space (S) as shown in FIG. 3 where the largest slope occurs corresponding to various the particle beam sizes (BS) in different pattern environments.

Referring to FIG. 9, which illustrates the space (S) values corresponding to the largest slope for various particle beam size (BS) among Iso, PD 50%, and PD 75% environments. The horizontal axis represents the particle beam size (BS) in nm, and the vertical axis represents the optimal space (S$_{opt}$) in nm. A curve 852 illustrates the optimal space (S$_{opt}$) for Iso environment, a curve 851 illustrates the optimal space (S$_{opt}$) for PD 50% and PD 785% environments, and a curve 853 represents the average optimal space (S$_{opt}$) derived from the curves 851 and 852. FIG. 9 reveals that the optimal space (S$_{opt}$) is strongly correlated among the three environments. A quadratic expression was derived with high fitting accuracy (0.90 R$^2$) to represent the relation between the optimal space (S$_{opt}$) and the corresponding particle beam size (BS) as follows:

$$S_{opt} = 0.018 \; BS^2 + 0.05 \; BS + 0.01.$$

In step of producing the imaging structure 903, a particle beam is used to expose a photoresist layer, resulting in the sequential production of the bottom layer (L$_1$) and the top layer (L$_2$) to create an imaging structure (L$_{1+2}$) within the photoresist layer. Due to the simulating optimal width (W$_{opt}$) and optimal space (S$_{opt}$) corresponding to various particle beam size (BS) in steps of initializing an imaging structure 901 and adjusting the imaging structure 902, the imaging structure (L$_{1+2}$) produced in step of producing the imaging structure 903 exhibits improved throughput, fidelity, and contrast in particle beam lithography. Returning to FIGS. 1 and 4, when the base pattern 31 on the bottom layer (L$_1$) is set with the optimal width (W$_{opt}$) and optimal space (S$_{opt}$) for placing the compensation pattern 41 on the top layer (L$_2$), the exposure results in a third imaging pattern 69. The third imaging pattern 69 is closer to the target pattern 21 compared with the second imaging pattern 64, illustrating the improvement in throughput, fidelity, and contrast achieved by the method in this disclosure.

The inventors have conducted research comparing the overall difference among the conventional shape, the method outlined in the present disclosure, and dose-based PEC correction methods, respectively.

Figure 10A:
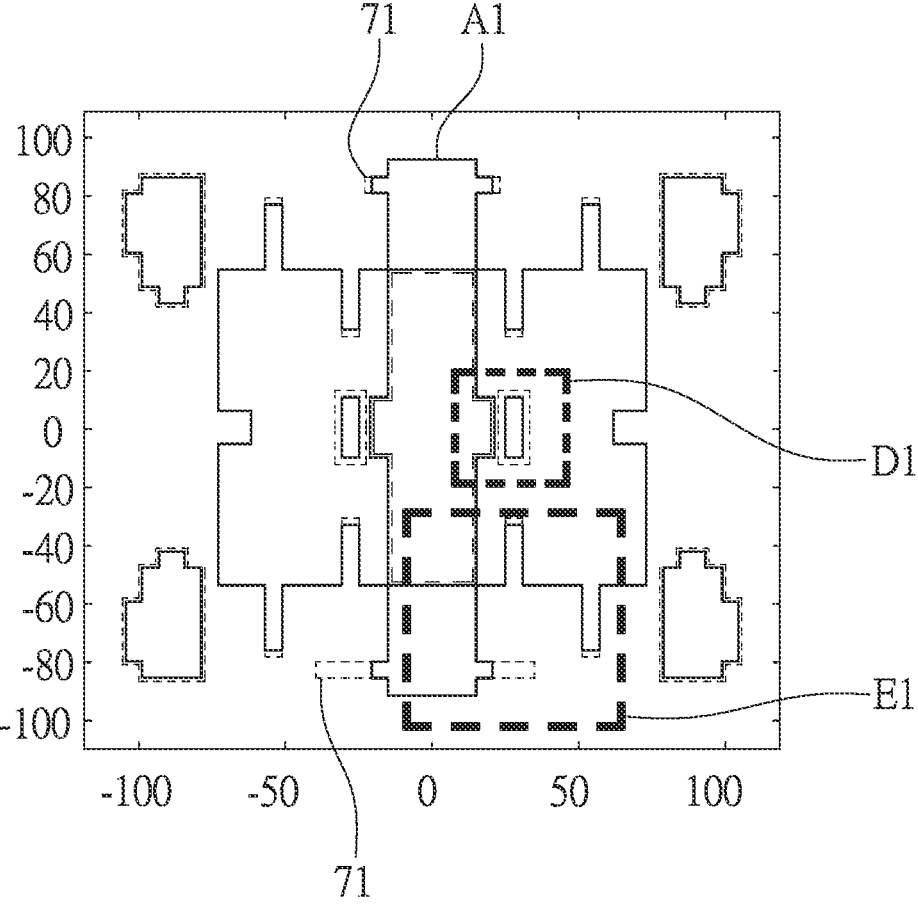
FIG. 10(a) is a top view of an imaging structure using a conventional shape correction method.
Figure 10B:
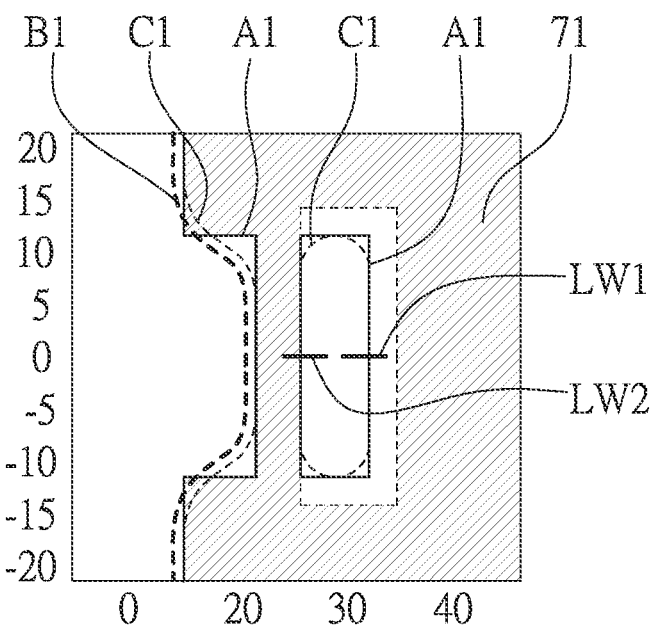
FIG. 10(b) illustrates the local structure of a region D1 as shown in FIG. 10(a).
Figure 10C:
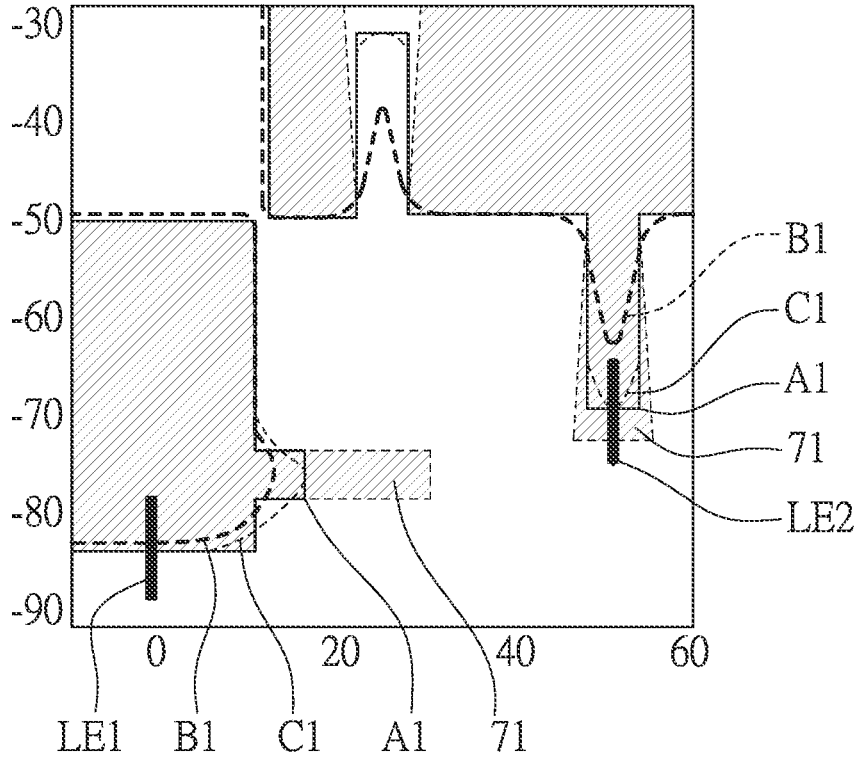
FIG. 10(c) illustrates the local structure of a region E1 as shown in FIG. 10(a).

FIGS. 10(*a*), 10(*b*), and 10(*c*) illustrate a top view of a first structure 71 using the conventional shape correction method. A line A1 represents the target pattern 21, line B1 represents the contour before correction for the 32 nm target pattern 21 when the particle beam size (BS)=5 nm, and line C1 represents the contour after correction for the 32 nm target pattern 21 when the particle beam size (BS)=5 nm. FIG. 10(*b*) provides an enlarged view of a region D1 as shown in FIG. 10(*a*), and includes comparison points LW1 and LW2. FIG. 10(*c*) provides an enlarged view of a region E1 as shown in FIG. 10(*a*), and includes comparison points LE1 and LE2. When using EPE of the conventional shape correction method to calculate the correction amount for contour distortion in the imaging structure, the correction effectiveness of shape modulation could be limited.

Figure 11A:
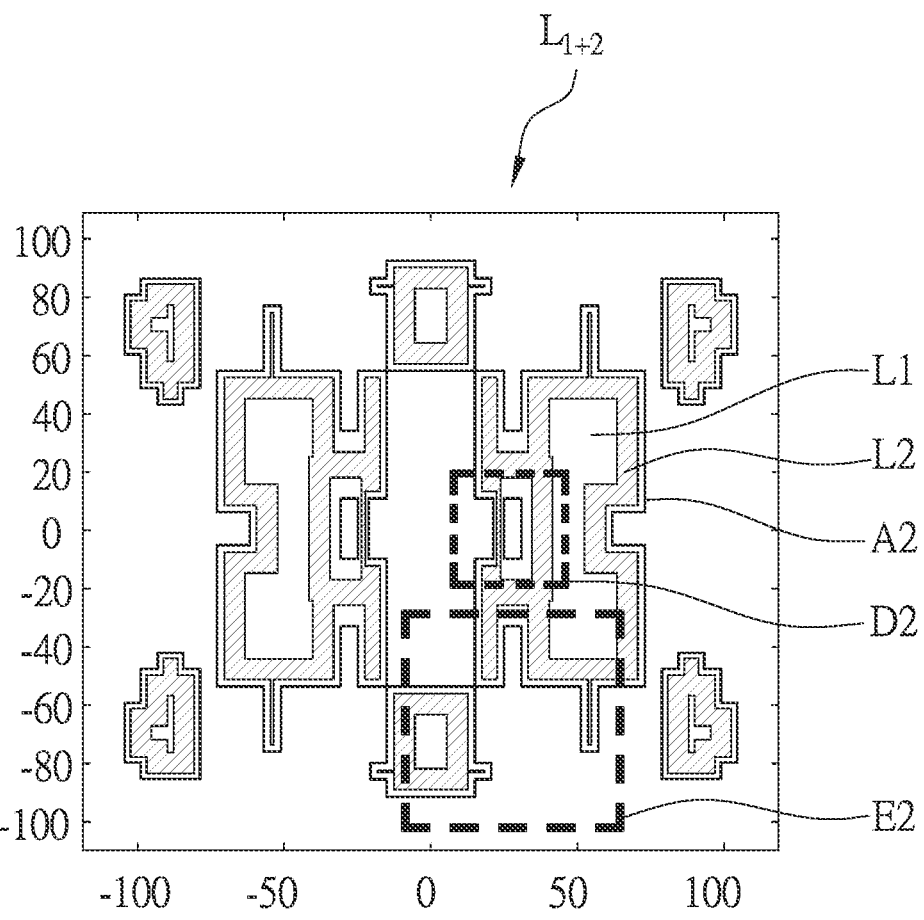
FIG. 11(a) is a top view of the imaging structure of the present disclosure.
Figure 11B:
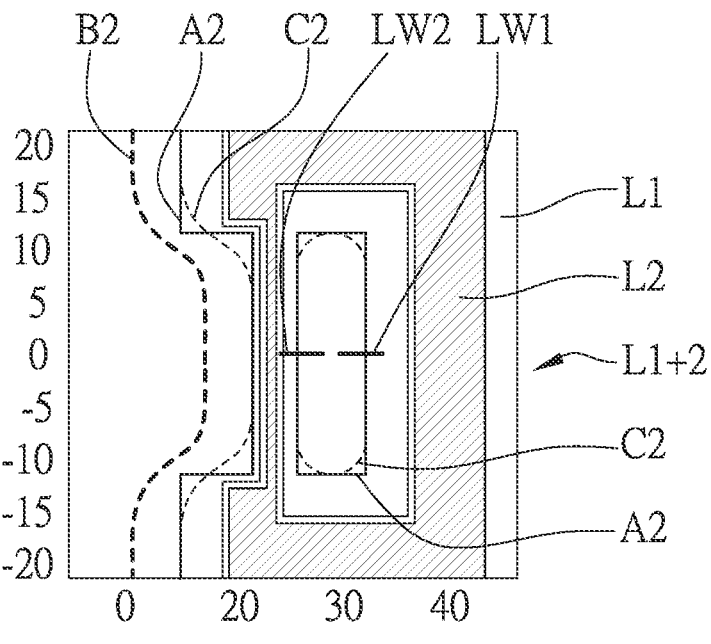
FIG. 11(*b*) illustrates the local structure of a region D2 as shown in FIG. 11(*a*).
Figure 11C:
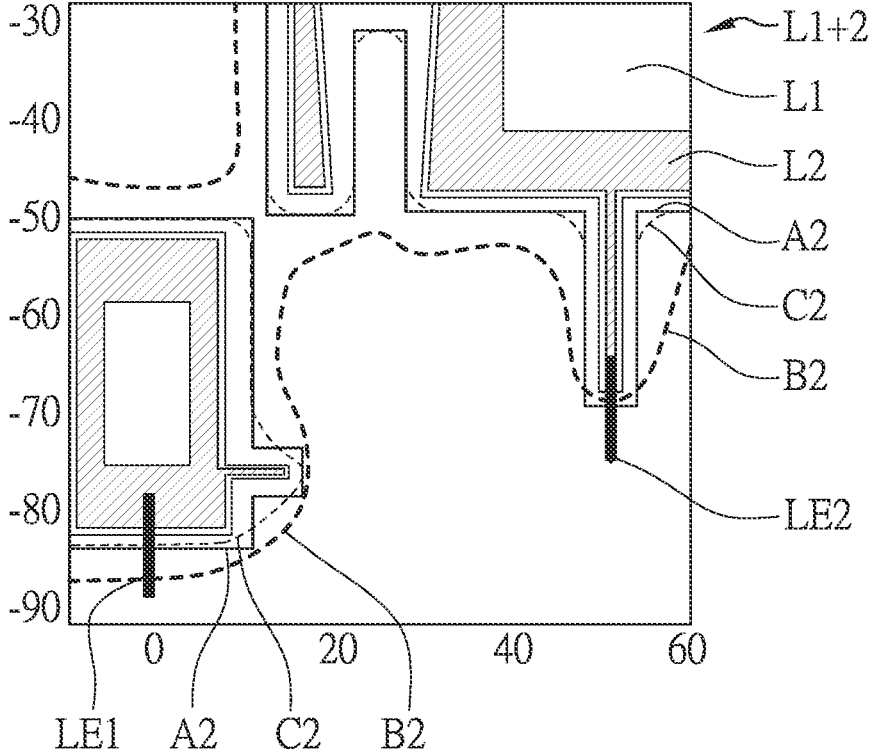

Refer to FIGS. 11(*a*), 11(*b*), and 11(*c*), illustrating a top view of the imaging structure (L$_{1+2}$) in accordance with aspects of the present disclosure. The imaging structure (L$_{1+2}$) includes the bottom layer (L$_1$) and the top layer (L$_2$). A line A2 represents the target pattern 21, line B2 represents the contour before correction for the 32 nm target pattern 21 when the particle beam size (BS)=5 nm, and line C2 represents the contour after correction for the 32 nm target pattern 21 when the particle beam size (BS)=5 nm. FIG. 11(*b*) provides an enlarged view of a region D2 as shown in FIG. 11(*a*), and includes comparison points LW1 and LW2. FIG. 11(*c*) provides an enlarged view of a region E2 as shown in FIG. 11(*a*), and includes comparison points LE1 and LE2. In FIG. 11, the optimal width (W$_{opt}$) was determined as 6.8 nm, and the optimal space (S$_{opt}$) was determined as 0.7 nm.

Figure 12A:
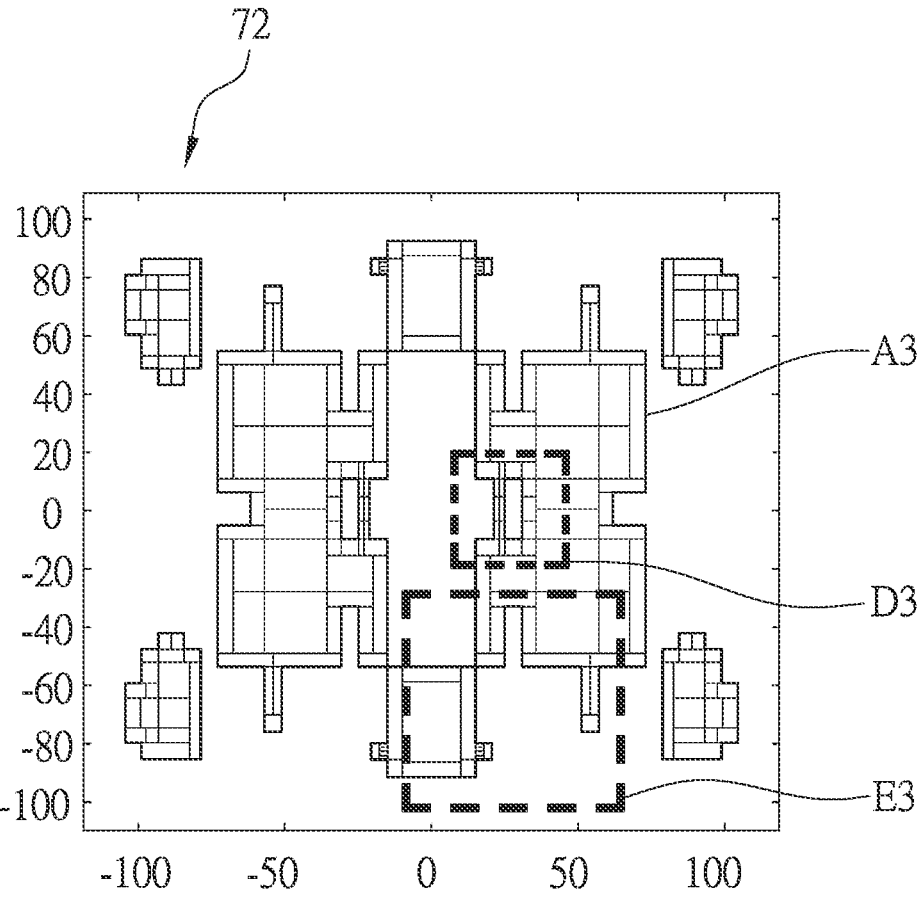
FIG. 12(*a*) is a top view of an imaging structure using a dose-based correction method.
Figure 12B:
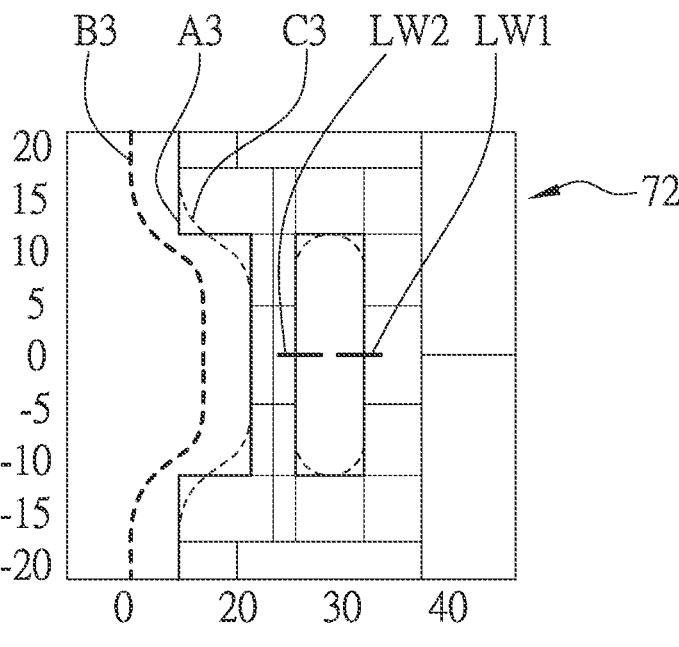
Figure 12C:
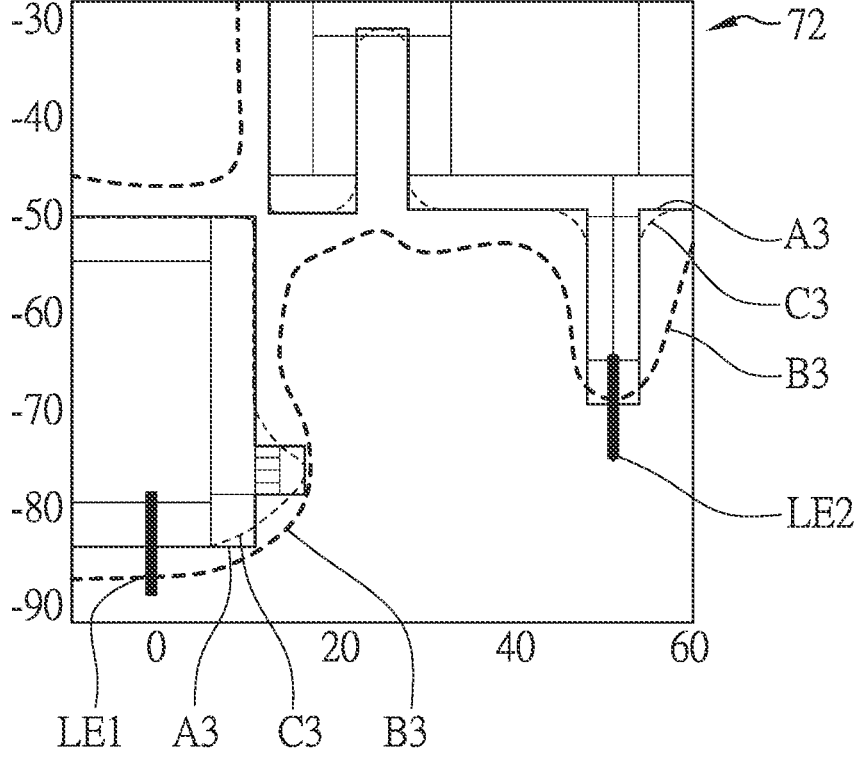

FIGS. 12(*a*), 12(*b*), and 12(*c*) illustrate a top view of a second structure 72 using the dose-based PEC correction method. A line A3 represents the target pattern 21, line B3 represents the contour before correction for the 32 nm target pattern 21 when the particle beam size (BS)=5 nm, and line C3 represents the contour after correction for the 32 nm target pattern 21 when the particle beam size (BS)=5 nm. FIG. 12(*b*) provides an enlarged view of a region D3 as shown in FIG. 12(*a*), and includes comparison points LW1 and LW2. FIG. 12(*c*) provides an enlarged view of a region E3 as shown in FIG. 12(*a*), and includes comparison points LE1 and LE2. In FIG. 12, conditions of the second structure 72 including the surrounding frame width, fracturing shape and number, initial dose of a bottom plane and top fracturing, and correction engine were determined with 5 nm minimum feature size, the same dissection as in the conventional shape correction method, the same on-target requirement, and the same PID controller, respectively, for reasonable comparison among the three methods. Through FIGS. 12(*a*) to (*b*), the second structure 72 is substantially consistent with the target pattern 21 in line A3. Within the multiple fragments defined by the second structure 72, although both FIG. 12(*a*) and FIG. 12(*b*) show white areas, the dose within the interior fragments of the second structure 72 is lower, while the dose within the fragments at the edges of the second structure 72 is higher. Especially, the fragments at the tips of the patterns have the highest dose, so as to adjust the exposure pattern. Since the second structure 72 is a known technique and not the primary focus of the present disclosure, the technical specifics will not be elaborated further herein.

As depicted in FIG. 10(*b*), FIG. 11(*b*), and FIG. 12(*b*), the lines B1, B2, and B3 do not appear within the spaces smaller than 6 nm (represented as hollow positions in the pattern).

This indicates that, before the adjustment of the particle beam size (BS), it is not possible to form the target patterns 21 smaller than 6 nm (hollow positions in the pattern). Only after the particle beam size (BS) is adjusted to 5 nm, the lines C1, C2, and C3 may appear within the target patterns 21 that are smaller than 6 nm (hollow positions in the pattern).

Through FIGS. 10(*b*) to 10(*c*), it is understood that the line C1 still exhibits significant differences from the target pattern 21. Therefore, the imaging pattern formed using the first structure 71 is prone to distortion. However, as shown in FIGS. 11(*b*) and 11(*c*), the line C2 is much closer to the target pattern 21. Compared with the distance between the first structure 71 and line A1, the imaging structure (L$_{1+2}$) may get closer to the line A2, resulting in an improvement of the pattern fidelity and contrast.

As presented in Table 1 below. G1 represents measurement values for the first structure 71, G2 represents measurement values for the imaging structure (L$_{1+2}$), and G3 represents measurement values for the second structure 72. PVB stands for process variation band, and EPE stands for edge-placement error. Table 1 summarizes the comparison among the three methods mentioned above and analyzes the improvements at comparison points LW1, LW2, LE1, and LE2. From Table 1, it is understood that the method of the present disclosure demonstrates average slope improvements of 95% and 8%, over the conventional shape and dose-based correction methods, respectively. Therefore, under the same target conditions, the method exhibits a better performance than the conventional shape and dose-based correction methods. Furthermore, the method exhibits a better slope compared with dose-based correction method because it utilizes only 2× dose (L$_1$+L$_2$), whereas in contrast, 3.8× modulated dose of the dose-based correction method is require in the comparison point LE2 for satisfying requirements of the target pattern 21. In addition, "dose" refers to the exposure dose, which is equal to the e-beam machine current multiplied by the exposure dwell time.

Concerning PVB, a smaller variation indicates higher contrast in the produced imaging pattern, making it more resistant to process changes. The imaging structure (L$_{1+2}$) has the smallest PVB. In comparison to the first structure 71 and the second structure 72, the imaging structure (L$_{1+2}$) may significantly enhance image contrast.

Concerning EPE, a lower EPE results in higher edge accuracy in the manufactured imaging pattern. Therefore, through examining the edges of the third imaging pattern 69 as shown in FIG. 4, it is understood that the imaging pattern produced by the imaging structure (L$_{1+2}$) exhibits the smallest EPE.

Compared with the method outlined in the present disclosure, although the dose-based correction method achieves the smallest PVB at comparison point LE2, it comes at the expense of approximately 200% dose increment. Furthermore, in comparison to conventional shape and dose-based correction methods, the method of the present disclosure may improve the image contrast. Additionally, the number of correction iterations for EPE convergence is reduced from 38 to 23 times and from 26 to 23 times over the conventional shape and dose-based correction methods, respectively. Moreover, the method saves an average of 56% calculation time per iteration over the dose-based correction method, because the number of dissections for shape modulation was less than that of the fractured plane and frame for dose modulation to satisfy the same on-target requirement.

Further, the mean and sigma values are listed in Table 1, and PVB with ±5% dose variations was used to evaluate the process margin performance. Table 1 reveals that the method of the present disclosure demonstrated average PVB improvements of 53% and 9% over the conventional shape and dose-based methods, respectively, by averaging the improvement (%) of comparison points LW1, LW2, LE1, LE2, mean and sigma values.

TABLE 1

| | | G1 | G2 | G3 | Comparison between G1 and G2 | Comparison between G2 and G3 |
|---|---|---|---|---|---|---|
| Slope | LW1 | 0.0384 | 0.0698 | 0.0434 | 82% | 61% |
| (a.u. $nm^{-1}$) | LW2 | 0.0246 | 0.0478 | 0.0417 | 94% | 15% |
| | LE1 | 0.0516 | 0.0981 | 0.0915 | 90% | 7% |
| | LE2 | 0.0229 | 0.0485 | 0.0991 | 112% | −51% |
| PVB (nm) | LW1 | 1.1 | 0.6 | 0.9 | 45% | 33% |
| | LW2 | 1.6 | 0.8 | 0.9 | 50% | 11% |
| | LE1 | 0.7 | 0.3 | 0.4 | 57% | 25% |
| | LE2 | 1.7 | 0.8 | 0.5 | 53% | −60% |
| Overall slope | Mean | 0.0428 | 0.0825 | 0.0766 | 93% | 8% |
| (a.u. $nm^{-1}$) | Sigma | 0.0156 | 0.0079 | 0.0142 | 49% | 44% |
| Overall PVB | Mean | 0.9 | 0.4 | 0.5 | 56% | 20% |
| (nm) | Sigma | 0.7 | 0.3 | 0.4 | 57% | 25% |
| Overall EPE | Mean | 0.0626 | 0.0414 | 0.0440 | 34% | 6% |
| (nm) | Sigma | 0.0809 | 0.0523 | 0.0713 | 35% | 27% |
| Iteration (times) | | 38 | 23 | 26 | 39% | 12% |
| Max. Dose (a.u.) | | 1 | 2 | 4 | Increment 200% | Decrement 200% |
| Normalized calculation time (a.u./iteration ) | | 1.00 | 1.00 | 1.56 | Increment 0% | Decrement 56% |

Figure 13:
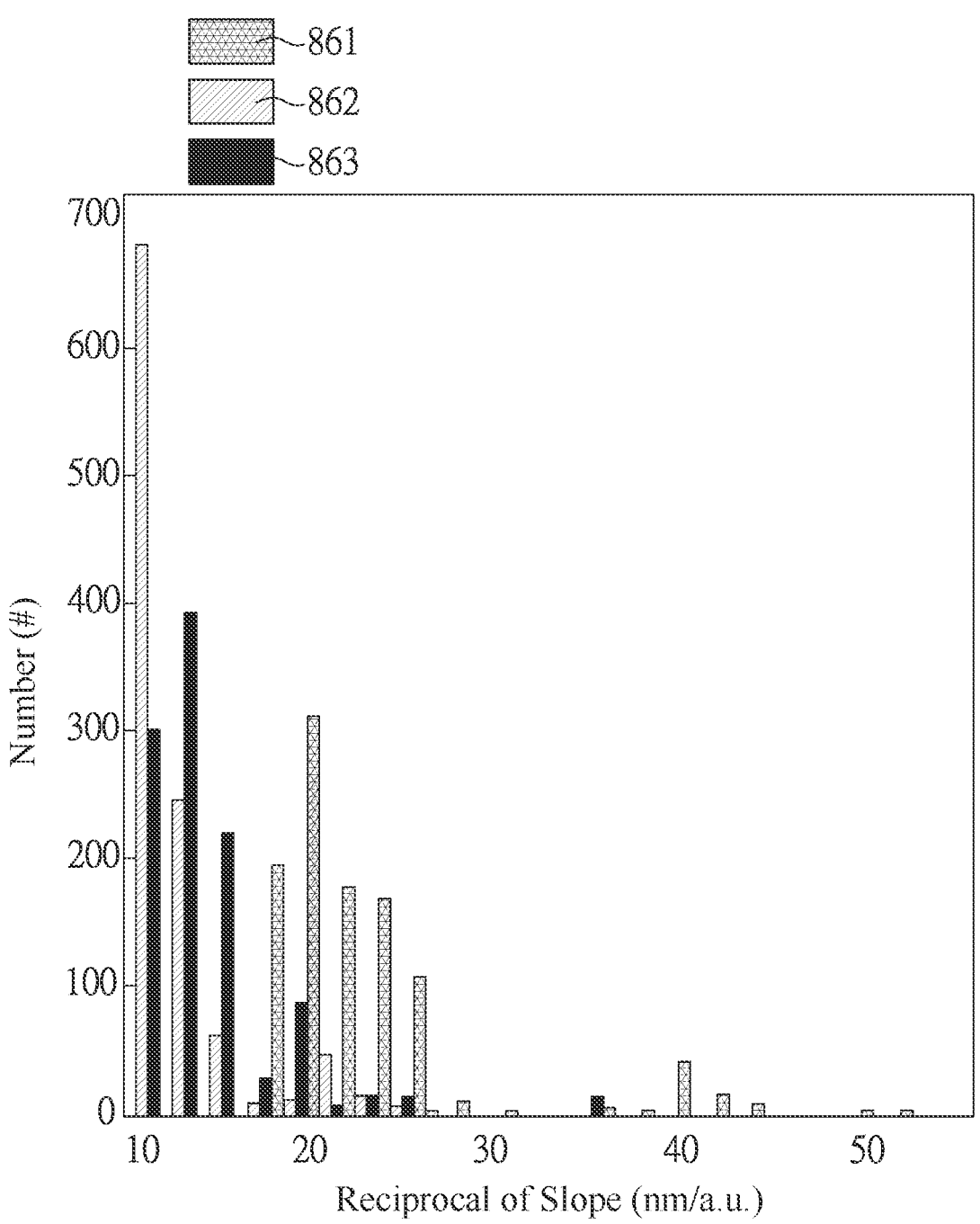
FIG. 13 exhibits the distribution comparison of the reciprocal slope (slope$^{-1}$) of each target point obtained by the three methods.

FIG. 13 illustrates a comparison of the distribution of the reciprocal of slope ($slope^{-1}$) counted from each target point 62 among the three methods. A smaller reciprocal of slope ($slope^{-1}$) indicates better slope performance. The conventional shape correction method is represented in the first set of data, the method of the present disclosure in the second set of data, and the dose-based correction method in the third set of data. The horizontal axis represents the reciprocal of slope ($slope^{-1}$) values in nm/a.u., and the vertical axis represents the number of target points 62 (no unit). Through FIG. 13, it is understood that the method of the present disclosure showed a higher number of smaller reciprocal of slope ($slope^{-1}$) and more concentrated distribution compared with the other two methods.

Figure 14:
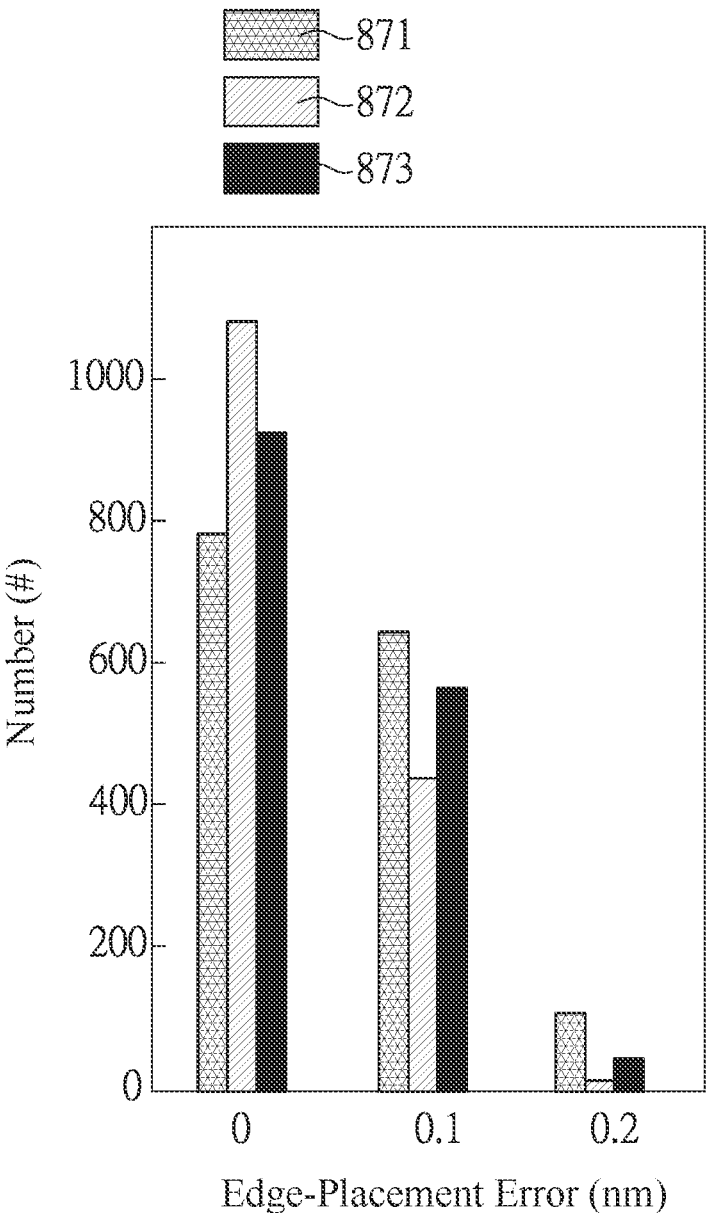
FIG. 14 exhibits the distribution comparison of the edge-placement error (EPE) of each target point obtained by the three methods.

FIG. 14 illustrates the distribution of the edge-placement error (EPE) for the three methods. The conventional shape correction method is represented in the fourth set of data, the method of the present disclosure in the fifth set of data, and the dose-based correction method in the sixth set of data. The horizontal axis represents the edge-placement error (EPE) values in nm, and the vertical axis represents the number of target points 62. Through FIG. 14, compared with the other two methods, it is understood that the method of the present disclosure exhibits higher energy slopes, smaller edge-placement error (EPE), and a more concentrated distribution.

FIGS. 13 and 14 reveal that the convergence of the edge-placement error (EPE) may be more accurately controlled through the method of the present disclosure. Additionally, when the energy slope becomes steeper, a finer edge-placement error (EPE) variations may be represented with the movement of the plurality of segments 61.

In summary, in step of initializing an imaging structure 901, an imaging structure ($L_{1+2}$) is established, which comprises the bottom layer ($L_1$) and the top layer ($L_2$). In step of adjusting the imaging structure 902, the relationship between the segments 61 and the accumulated energy intensity is analyzed to determine the relationship between the top layer ($L_2$) and the bottom layer ($L_1$). The segments 61 are adjustable to achieve better image contrast, and with the use of the optimal width ($W_{opt}$) and optimal space ($S_{opt}$), the best fidelity for the corresponding particle beam size (BS) is obtained. Therefore, the features of the present disclosure are achieved.

Although the concept herein has been described with reference to particular examples, it is to be understood that these examples are merely illustrative of the principles and applications of the present concept. It is therefore to be understood that numerous modifications may be made to the illustrative examples and that other arrangements may be devised without departing from the spirit and scope of the present concept as defined by the appended claims.

What is claimed is:

1. A shape-based proximity effect correction method for throughput, patterning fidelity, and contrast enhancement of particle beam lithography, comprising:

a step of initializing an imaging structure, wherein a target pattern is established, and an imaging structure ($L_{1+2}$) is initialized, wherein the imaging structure ($L_{1+2}$) includes a bottom layer ($L_1$) with a base pattern, a top layer ($L_2$) positioned on the upper surface of the bottom layer ($L_1$) with a compensatory pattern, a width (W) defined by the opposing sides of the compensatory pattern on the top layer ($L_2$), and a space (S) defined by the lateral sides of the base pattern on the bottom layer ($L_1$) and the lateral sides of the compensation pattern on the top layer ($L_2$), wherein the imaging structure ($L_{1+2}$) serves for producing an imaging pattern using an exposure device; and a step of adjusting the imaging structure, wherein a correction amount calculated based on the combinations of the width (W) and space (S) values is used to simultaneously modify the base pattern on the bottom layer ($L_1$) and the compensatory pattern on the top layer ($L_2$), and the imaging pattern is stimulated for correction until the contour variation between the corrected imaging pattern and the target pattern falls within a defined tolerance range to obtain an optimal width ($W_{opt}$) and an optimal space ($S_{opt}$).

2. The shape-based proximity effect correction method for throughput, patterning fidelity, and contrast enhancement of particle beam lithography according to claim 1, further comprises a step of producing the imaging structure that follows the step of adjusting the imaging structure, wherein a particle beam is used to expose a photoresist layer, and the bottom layer ($L_1$) and the top layer ($L_2$) are sequentially generated, resulting in the formation of the imaging structure ($L_{1+2}$) within the photoresist layer.

3. The shape-based proximity effect correction method for throughput, patterning fidelity, and contrast enhancement of particle beam lithography according to claim 2, wherein in the step of adjusting the imaging structure, the space (S) of the imaging structure ($L_{1+2}$) is set to 0, different particle beam sizes (BS) and different widths (W) are analyzed for their impact on the energy slope within the imaging structure ($L_{1+2}$), and the optimal width ($W_{opt}$) is defined for the various particle beam sizes (BS), where the relationship between the optimal width ($W_{opt}$) and the corresponding particle beam size (BS) is as follows:

$$W_{opt} = 0.86\ BS + 2.49.$$

4. The shape-based proximity effect correction method for throughput, patterning fidelity, and contrast enhancement of particle beam lithography according to claim 3, wherein in the step of adjusting the imaging structure, the energy slope generated within the imaging structure ($L_{1+2}$) at different spaces (S) is analyzed based on different particle beam sizes (BS) and their corresponding optimal widths ($W_{opt}$), the optimal space ($S_{opt}$) is calculated by determining the largest achievable slope, where the relationship between the optimal space ($S_{opt}$) and the corresponding particle beam size (BS) is as follows:

14

$$S_{opt} = 0.018\ BS^2 + 0.05\ BS + 0.01.$$

5. The shape-based proximity effect correction method for throughput, patterning fidelity, and contrast enhancement of particle beam lithography according to claim 4, wherein in the step of initializing a imaging structure, a plurality of segments along the edges of the target pattern, and a plurality of target points positioned on the plurality of segments are defined, wherein the plurality of segments are adjustable to outline the shape of the target pattern, and the shape of the base pattern for the bottom layer ($L_1$) is defined using the plurality of segments and target points.

6. The shape-based proximity effect correction method for throughput, patterning fidelity, and contrast enhancement of particle beam lithography according to claim 5, wherein in the step of adjusting the imaging structure, various particle beam sizes (BS) are configured, and simulations are performed on the imaging structure ($L_{1+2}$).

7. An imaging structure, produced by the shape-based proximity effect correction method for throughput, patterning fidelity, and contrast enhancement of particle beam lithography as claimed in claim 1, comprising:
   a bottom layer ($L_1$) including a base pattern;
   a top layer ($L_2$) positioned on the bottom layer ($L_1$) and including a compensatory pattern;
   a width (W) defined by the opposing sides of the compensatory pattern on the top layer ($L_2$); and
   a space (S) defined by the lateral sides of the base pattern on the bottom layer ($L_1$) and the lateral sides of the compensation pattern on the top layer ($L_2$).

8. The imaging structure according to claim 7, wherein the imaging structure is employed in the exposure process for semiconductors, a particle beam size (BS) is selected for exposure, the width (W) is chosen from an optimal width ($W_{opt}$), and the space (S) is chosen from an optimal space ($S_{opt}$).

9. The imaging structure according to claim 8, wherein $W_{opt}$=0.86BS+2.49, and $S_{opt}$=20.018BS²+0.05BS+0.01.

* * * * *